United States Patent [19]
Gorenz, Jr. et al.

[11] Patent Number: 5,614,694
[45] Date of Patent: Mar. 25, 1997

[54] ONE PIECE OPEN AND CLOSABLE METAL RF SHIELD

[75] Inventors: Harold J. Gorenz, Jr., Lisle; Jeffery P. Hasler, Schaumburg; James R. Mudra; Gary D. Schulz, both of Cary, all of Ill.

[73] Assignee: Motorola, Inc., Schaumburg, Ill.

[21] Appl. No.: 417,131

[22] Filed: Mar. 31, 1995

[51] Int. Cl.[6] ........................................ H05K 9/00
[52] U.S. Cl. ........................................ 174/35 R
[58] Field of Search .................... 174/35 R, 35 MS, 174/356 C, 50; 206/145, 147, 152, 170, 275, 320, 328, 329, 332, 461, 462, 517, 577, 271, 273, 274, 287, 481, 494; 220/6, 7, 666, 230, 238, DIG. 21; 331/67; 334/85; 361/816, 818

[56] References Cited

U.S. PATENT DOCUMENTS

| | | | |
|---|---|---|---|
| 2,488,710 | 11/1949 | Cooper | 174/35 |
| 4,370,515 | 1/1983 | Donaldson | 174/35 R |
| 4,816,613 | 3/1989 | Ito et al. | 174/35 R |
| 4,901,911 | 2/1990 | Drexhage | 229/114 |
| 5,316,165 | 5/1994 | Moran, Jr. | 220/62 |
| 5,355,998 | 10/1994 | Bienaime | 206/145 |
| 5,365,410 | 11/1994 | Lonka | 361/816 |

*Primary Examiner*—Bot L. Ledynh
*Attorney, Agent, or Firm*—Donna Rogers Maddox

[57] ABSTRACT

An RF shield for use on tightly packed printed circuit boards has a normally-closed lid that can be opened to provide repair access to shielded components and then reclosed. The shield is a five-sided metal can having a top surface (12) with a lid defined on one edge by a fold line (20) and on the other three edges by partial shear lines (22, 24, 26) through the thickness of the metal top surface. The shear lines define frangible connections between the lid and top surface (18) that can be severed to allow the lid to open. The fold line serves as a hinge about which the lid can pivot for opening. Upon closing the lid can be spot-soldered to hold it shut.

10 Claims, 2 Drawing Sheets

ONE PIECE OPEN AND CLOSABLE METAL RF SHIELD

FIELD OF THE INVENTION

This invention relates generally to RFI (radio frequency interference) shielding, and more particularly to a one piece open and closable metal RF shield.

BACKGROUND OF THE INVENTION

RF modules typically require RFI (radio frequency interference) shielding in order to function properly. The shielding reduces interference not only from external sources, but also from various functional blocks within the RF module. A typical prior art RF shield is a five-sided metal enclosure, known as a can, that is mounted on the PCB (printed circuit board) and fits over the shielded components. The can is often soldered to the board at the same time as the electronic components on the board. However, repairing misplaced components and fixing other problems underneath a soldered RF shield is impossible without removing the shield. Removing a soldered shield is an expensive and time consuming task that can cause additional damage to the assembly and/or possibly remove the original fault leading to no-trouble-found defects. The access problem with soldered can RF shields can be avoided by using shields that are easily opened when repair work is necessary.

Such openable shields are known and in the past have included snap-on shields, fences and shields with removable lids. All of the known openable shields are limited to use in environments where there is plenty of space on the PCB to incorporate such designs. As PCB's get ever smaller and more densely packed, there is no longer room for the bulky openable shields of the prior art. One alternative to openable shields is to use standard cans that cannot be opened and simply scrap any units having defects. This is usually not cost effective, especially with new designs that may have low yields of non-defective units in the early stages of production. Another alternative is to solder all the components except the shield, test the board, fix any problems found and then solder the standard can onto the board. This has the drawback of effectively cutting the throughput of a reflow soldering oven in half or requiring the purchase of a second oven and a line to support it. Moreover, every additional pass through the oven may significantly degrade the lifetime performance of the module, and it becomes more difficult to place the shields on reflowed solder pads. Also, an additional pass through a reflow oven may render a previously functional unit non-functional due to components moving during the process. In some modules component placement and packaging are so dense that it is virtually impossible to reach in with a soldering iron to reflow a shield. Furthermore, once the shield is replaced it must be coplanar with the PCB in order to fit within the module's covers. These alternatives to an openable shield are not attractive so the need is evident for an openable shield that requires no more space than that used by a standard non-openable can type RF shield.

DETAILED DESCRIPTION OF THE INVENTION

The present invention concerns an RFI shield that can be opened and closed to permit repairs to underlying shielded components while taking up minimum space on a circuit board. The RF shield may be used anywhere that a shield must cover a group of components that might be considered a potential source of defects. The invention may be used on any electrical device that requires RFI/EMI shielding whether to shield incoming or outgoing emissions. Examples include computers, cellular telephones, pagers, modems, radios and the like.

The openable RF shield of the invention is a metal can having a top surface and a plurality of walls depending from the top surface. The top surface and walls are arranged to define an interior space in which electrical components to be shielded will reside. The top surface has a fold to define a hinge line. Three partial shear lines are also formed in the top surface. The hinge line and partial shear lines together define a lid embossed in the top surface. The partial shear lines frangibly connect the lid to the top surface. A series of openings along the partial shear lines allow insertion of a tool to sever the connections between the lid and top surface along the shear lines. The lid can then be pivoted about the hinge line to expose the electronic components underneath the shield for repair. Upon completion of the repair the lid can be reclosed and spot-soldered to retain it in the closed position.

Figure 1:
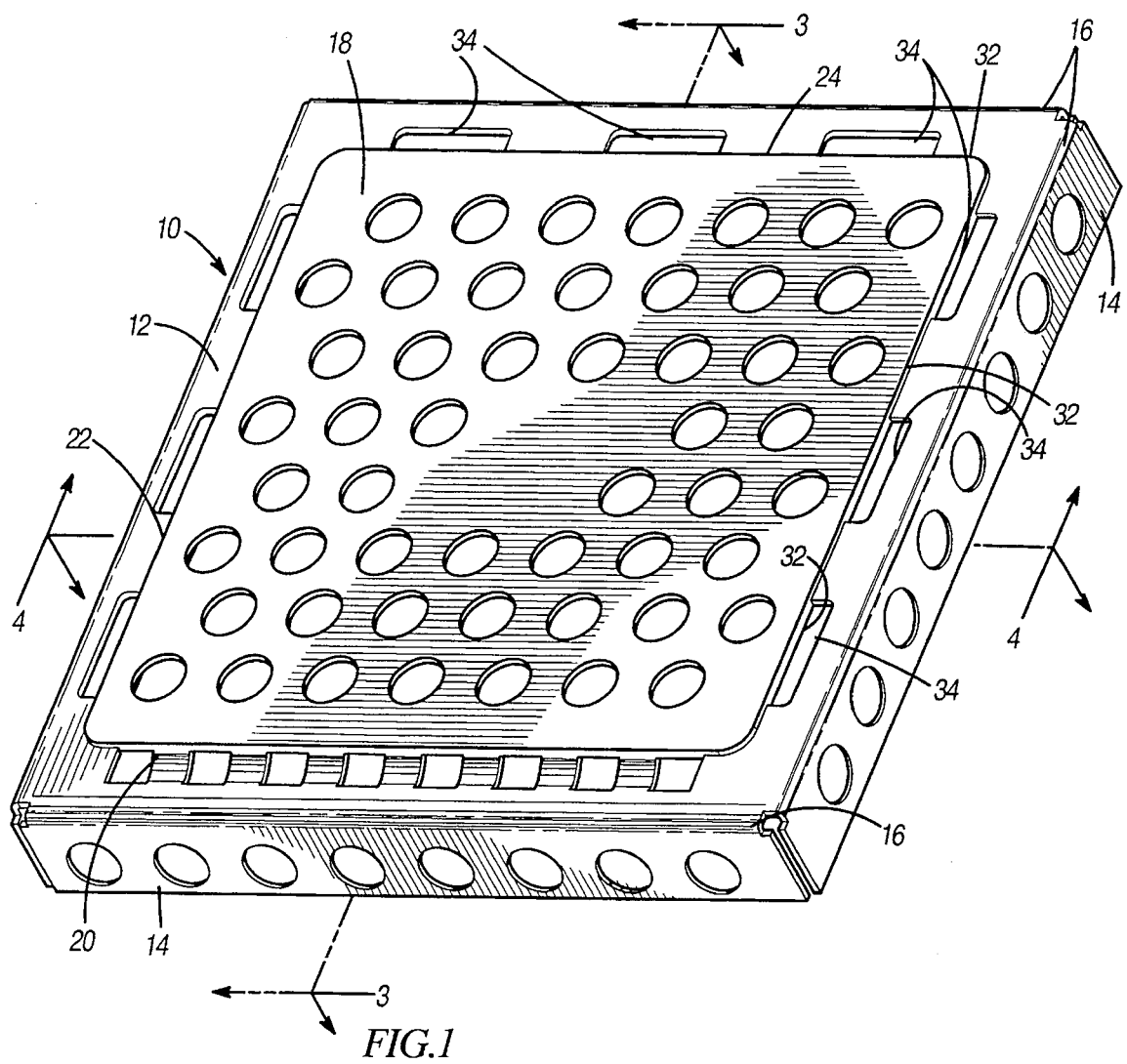
FIG. 1 is a perspective view of the RF shield of the present invention.
Figure 2:
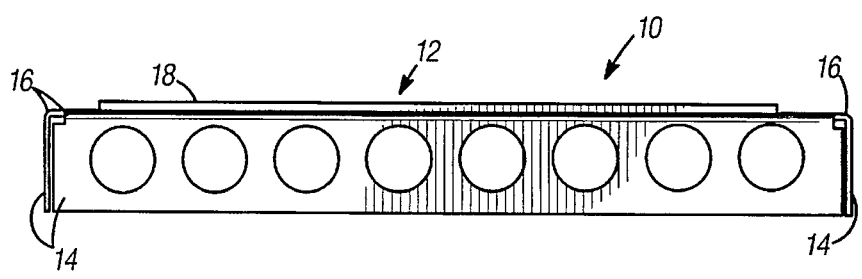
FIG. 2 is an end elevation view of the RF shield.
Figure 5:
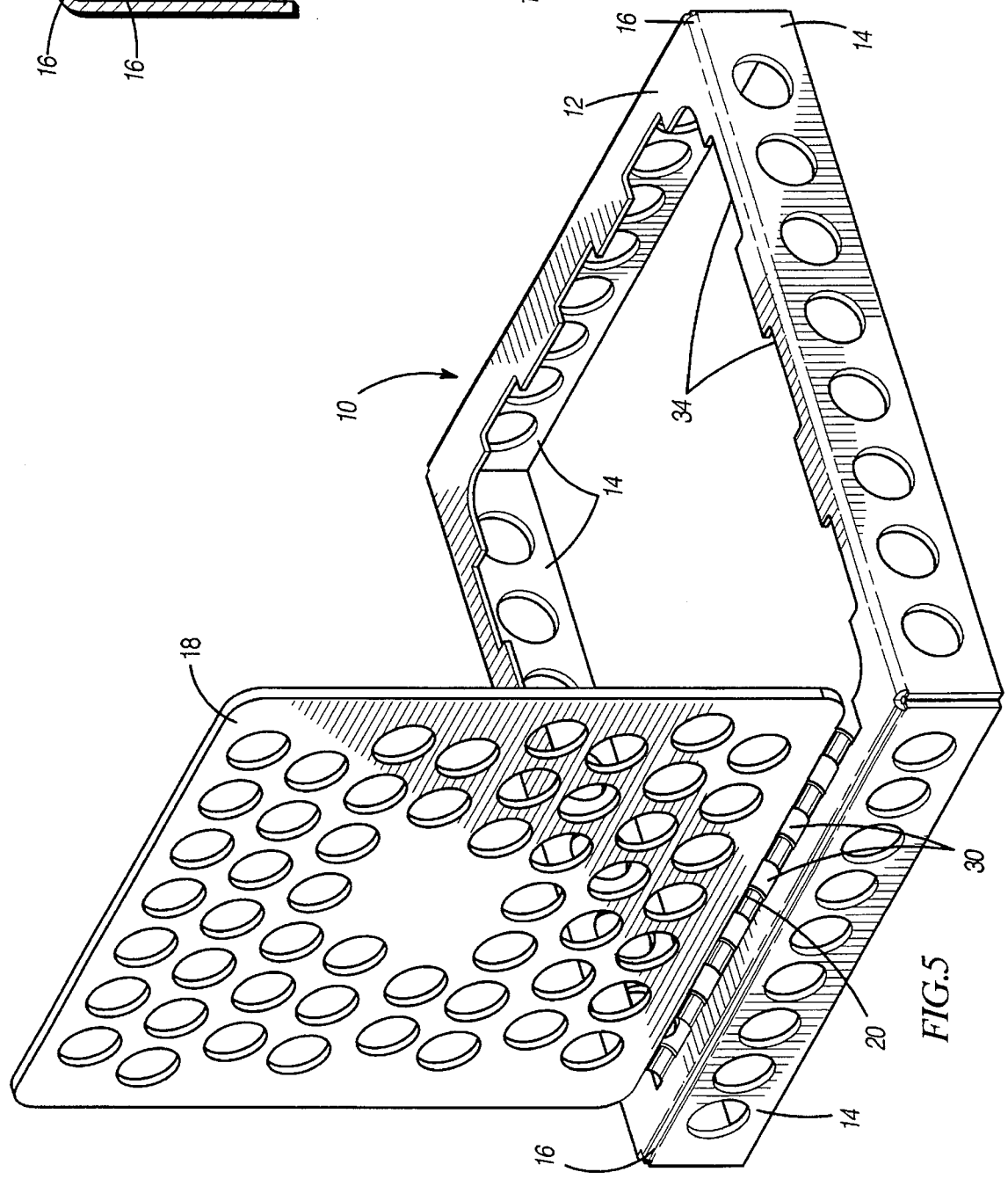
FIG. 5 is a perspective view of the shield with the lid open.

The RF shield is illustrated generally at 10 in FIGS. 1, 2 and 5. In the preferred embodiment shown the shield 10 is a one piece, five-sided can made of metal. The metal can be perforated as shown, or it could be solid. The can has a top surface 12 and four side walls 14. The side walls are joined to the top surface at rounded corners 16. Preferably the walls are bent or folded down from the top surface. Together the top and side walls comprise an enclosure having an interior space in which electronic components to be shielded will reside. The enclosure has an aperture through the top surface, best seen in FIG. 5, for providing service access to the shielded components.

Figure 3:
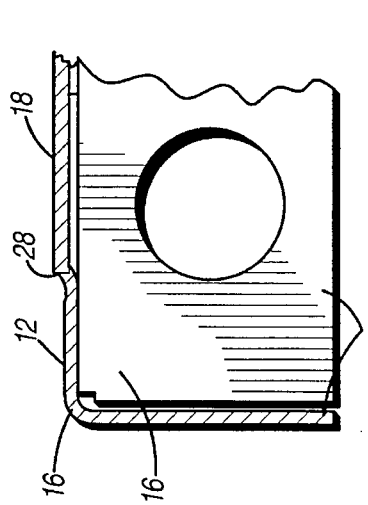
FIG. 3 is a section taken along line 3—3 of FIG. 1, showing the hinge line.

The top surface has an upraised or embossed lid 18. The lid normally closes the aperture and is defined by a hinge line 20 and partial shear lines 22, 24 and 26. The hinge line 20 is formed by bending the top lid in a normal S-bend as shown in the detail view of FIG. 3 at 28. A series of perforations 30 (FIG. 1) are spaced along the hinge line 20 to allow the lid to open and close without deforming the rest of the shield or breaking it free from the solder pads on the circuit board.

Figure 4:
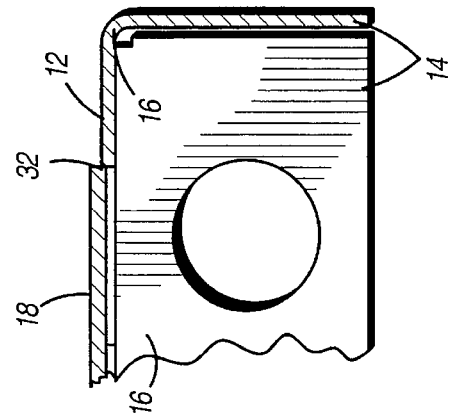
FIG. 4 is a section taken along line 4—4 of FIG. 1, showing a partial shear line.

An enlarged view of a partial shear line is shown in FIG. 4. Along the partial shear lines the metal is sheared, not bent. The shear extends almost all the way through the thickness of the top surface 12. The small, unsheared portion of the thickness provides a frangible connection 32 between the lid and top surface. As can be seen the shear lines and hinge line raise the lid slightly and in equal amounts from the top surface. Thus, the entire lid remains parallel to the nominal plane of the top surface and perpendicular to the side walls.

A plurality of break-open slots 34 are provided, one adjacent each of the frangible connections 32 of the partial shear lines 22, 24 and 26. The dimensions of the slots 34 are small enough to provide the required RFI attenuation. The slots 34 allow insertion of a tool, such as a small screwdriver, for prying the lid 18 upwardly and in the process severing the frangible connections 32 along the partial shear lines. Preferably each of the break-open slots will be used and only the local frangible connection broken from each slot, thereby minimizing the potential for deforming the shield when opening it. Once all the connections are severed the lid can be opened by pivoting it along the hinge line 20, as illustrated in FIG. 5. This exposes the components in the interior space of the shield, making them accessible for repair. When repairs are completed, the lid is reclosed. If desired the lid may be spot-soldered to keep it shut.

The shield of the present invention allows for simple rework of rejected parts without adding another reflow line to the assembly operation. The RF shield can be reflow soldered to the PCB using standard manufacturing procedures. After reflow the PCB can be tested. If the PCB fails the test and the tests indicate the problem to be underneath the RF shield, then the PCB can be forwarded to the proper rework station where a technician can simply pry open the can, fix the problem, retest the board, shut the lid and solder it closed.

While a preferred form of the invention has been shown and described, it will be realized that alterations and modifications may be made thereto without departing from the scope of the following claims. For example, while a rectangular can is shown, other configurations could be used, such as a cylindrical can. Also, while three partial shear lines are shown resulting in rectangular shape for the lid, the lid shape could be altered as circumstances dictate. A D-shaped lid in a cylindrical can might be desirable, for example.

It will be apparent to those skilled in the art that the disclosed invention may be modified in numerous ways and may assume many embodiments other than the preferred forms particularly set out and described above. Accordingly, it is intended by the appended claims to cover all modifications of the invention that fall within the true spirit and scope of the invention and its equivalents.

What is claimed is:

1. An R.F. shield comprising an enclosure defining an interior space in which electrical components to be shielded will reside, the enclosure being formed of metal of a first thickness and having an aperture therethrough for providing access to said interior space, said aperture being closable by a lid, a first portion of the lid being pivotably joined to the enclosure by an integral hinge, the metal of the hinge being of the first thickness, and a second portion of the lid being joined to the enclosure by at least one integral frangible connection comprising metal sheared through to a second thickness, less than the first thickness, to releasably hold the lid in a closed position in relation to the aperture until access to the interior space is desired at which time said frangible connection can be severed allowing the lid to pivot about the hinge and open the aperture.

2. The RF shield of claim 1 further comprising at least one break-open slot formed in the enclosure adjacent said frangible connection.

3. The RF shield of claim 1 wherein the enclosure comprises a top surface and a plurality of walls depending from the top surface, the aperture being in the top surface.

4. The RF shield of claim 1 wherein the frangible connection is defined by a partial shear through the enclosure, the partial shear partially but not fully separating the lid from the enclosure.

5. The RF shield of claim 1 wherein the hinge comprises a bend line in the enclosure along one edge of the lid.

6. The RF shield of claim 5 further comprising a plurality of perforations spaced along the bend line.

7. An R.F. shield comprising an enclosure defining an interior space in which electrical components to be shielded will reside, the enclosure having an aperture therethrough for providing access to said interior space said aperture being closable by a lid, a first portion of the lid being pivotably joined to the enclosure by hinge and a second portion of the lid being joined to the enclosure by at least one frangible connection, to releasably hold the lid in a closed position in relation to the aperture until access to the interior space is desired at which time said frangible connection can be severed allowing the lid to pivot about the hinge and open the aperture, wherein the enclosure comprises a top surface and a plurality of walls depending from the top surface, the aperture being in the top surface, the frangible connection being defined by a partial shear through the thickness of the top surface that partially but not fully lifts the lid upwardly from the top surface, and the hinge comprising a bend line in the top surface along one edge of the lid, the bend lifting the lid upwardly from the top surface to the same extent as the partial shear.

8. An RF shield comprising:

a top surface;

a plurality of walls depending from the top surface such that the top surface and walls define an interior space in which electrical components to be shielded will reside; and a lid embossed in the top surface, a first side of the lid being defined by a fold in the top surface comprising metal having a first thickness and a second side of the lid being defined by a partial shear line where the partial shear line comprises metal sheared through to a second thickness, less than the first thickness.

9. The RF shield of claim 8 further comprising at least one break-open slot formed in the top surface adjacent said partial shear line.

10. The RF shield of claim 8 further comprising a plurality of perforations spaced along the hinge line.

* * * * *